United States Patent [19]
DeMoor et al.

[11] Patent Number: 5,514,972
[45] Date of Patent: May 7, 1996

[54] VOLTAGE COMPARISON CIRCUIT

[75] Inventors: Mark K. DeMoor, Apalachin, N.Y.; Paul W. Graf; Jonathan J. Hurd, both of Lexington, Ky.

[73] Assignee: International Business Machines Corporation, Armonk, N.Y.

[21] Appl. No.: 326,627

[22] Filed: Oct. 20, 1994

[51] Int. Cl.$^6$ .............................. G01R 27/26; H03K 5/22
[52] U.S. Cl. ........................ 324/678; 324/677; 324/713; 327/63; 327/65
[58] Field of Search ................................. 324/678, 679, 324/713; 327/63, 65, 91, 337, 407, 563

[56] References Cited

U.S. PATENT DOCUMENTS

| | | | |
|---|---|---|---|
| 4,547,683 | 10/1985 | Bingham | 327/3 |
| 4,707,624 | 11/1987 | Yee | 327/362 |
| 4,803,382 | 2/1989 | Tanimoto et al. | 327/77 |
| 4,803,462 | 2/1989 | Hester et al. | 327/407 X |
| 4,899,068 | 2/1990 | Klose et al. | 327/89 |
| 5,113,090 | 5/1992 | Imaizumi et al. | 327/69 |

Primary Examiner—Kenneth A. Wieder
Assistant Examiner—Diep Do
Attorney, Agent, or Firm—Arthur J. Samodovitz

[57] ABSTRACT

A circuit compares a difference between first and second voltages to a predetermined voltage. The circuit comprises an amplifier having first and second inputs. First and second capacitors are each coupled at one end to the first input of the amplifier. The first capacitor is charged with the first voltage and subsequently discharged. The second capacitor is charged with a first reference voltage and subsequently discharged. Third and fourth capacitors are each coupled at one end to the second input of the amplifier. The third capacitor is charged with the second voltage and subsequently discharged. The fourth capacitor is charged with a second reference voltage and subsequently discharged.

25 Claims, 2 Drawing Sheets

VOLTAGE COMPARISON CIRCUIT

BACKGROUND OF THE INVENTION

The invention relates generally to voltage comparison circuits, and deals more particularly with a circuit which compares a differential input voltage to a predetermined voltage.

Voltage comparison circuits are well known which compare a single ended input voltage to a predetermined voltage. If the input voltage exceeds the predetermined voltage, then some appropriate action can be taken. Also, a number of such circuits with different threshold levels can be used to perform an analog to digital conversion of the input voltage. This is accomplished by using multiple comparators with different thresholds to quantize an analog signal, as in a flash A/D converter.

The simplest form of prior art comparison circuit for a singled ended input voltage comprises a high gain amplifier having one input connected to a reference voltage and the other input connected to the singled ended input voltage.

FIG. 1 illustrates another voltage comparison circuit 10 according to the prior art for comparing a single ended input voltage Vin to a predetermined voltage C2/C1×Vref. Circuit 10 is preferred over the simple prior art circuit described above when the circuit is implemented on an integrated circuit that has precision capacitor ratios and FET switches that require little chip area. Circuit 10 comprises an amplifier 30 and four switches or "transfer gates" S1–S4 which are formed from P or N channel MOS devices such as illustrated in U.S. Pat. 4,899,068. Switches S1 and S3 selectively pass the input voltage Vin and reference voltage Vref to precision capacitors C1 and C2, respectively. The other ends of capacitors C1 and C2 are connected together and to the inverting input of amplifier 30. Switches S2 and S4 selectively discharge the precision capacitors C1 and C2, respectively. As indicated by common switch control Phi1, switches S1 and S4 are operated in unison, and as indicated by common switch control Phi2, switches S2 and S3 are operated in unison. Thus, capacitor C1 is charged by the input voltage Vin at the same time that capacitor C2 is discharged, and capacitor C2 is charged by the reference voltage Vref at the same time that capacitor C1 is discharged. Voltage comparison circuit 10 also includes a switch Sa1 which is formed from a P or N channel MOS device and connected between the output of amplifier 30 and the inverting input. Switch control Phi1a controls switch Sa1. Amplifier 30 is capable of high gain when switch Sa1 is open (i.e open loop), for example 10,000. When switch Sa1 is closed, the output is shorted to the inverting input and amplifier 30 is configured for unity gain. The feedback path when shorted nulls any offset voltage present between the inverting and noninverting inputs of amplifier 30. A parasitic (inherent) capacitance Cp1 to ground is also illustrated.

FIG. 2 illustrates the timing provided by a state machine 35 for controlling switches S1–S4 and Sa1. At time T0, switches S1 and S4 are closed as well as switch Sa1. Thus, capacitor C1 is charged by the input voltage Vin, capacitor C2 is discharged, and any offset at the inputs to amplifier 30 is nulled. Shortly before T1, switch Sa1 is opened to cause the large gain of amplifier 30. At T1, the voltage at the noninverting input is unknown and represented by Vi, switches S1 and S4 are opened and switches S2 and S3 are closed. Because switch Sa1 was opened shortly before T1, the voltage at the inverting input is still Vi at time T1. Because the charge on capacitors C1, C2 and Cp cannot change instantaneously, the total charge Qt at the inverting input of amplifier 30 at T1 is as follows:

$$Qt1=C1(Vi-Vin)+C2\times Vi+Cp1\times Vi.$$

At time T2, the voltage at the inverting input is unknown and represented by Vf, and the total charge at the inverting input of amplifier 30 is as follows:

$$Qt2=C1\times Vf+C2(Vf-Vref)+Cp1\times Vf.$$

The total charge at the inverting input of amplifier 30 does not change from T1 to T2 due to conservation of charge. Therefore, Qt1=Qt2 and $$C1(Vi-Vin)+C2\times Vi+Cp1\times Vi=C1\times Vf+C2(Vf-Vref)+Cp1\times Vf$$

$$Vf-Vi=-C1\times Vin/Ct+C2\times Vref/Ct$$

$$Ct=C1+C2+Cp1$$

Therefore, the output voltage Vo of amplifier 30 at T2 is as follows:

$$Vo=Av(Vf-Vi)$$

where Av is the open ended gain of amplifier 30. Assuming Av is large enough to saturate amplifier 30 for small differences between Vf and Vi:

Vo is a logic 1 when Vin<Vref×C2/C1

Vo is a logic 0 when Vin>Vref×C2/C1. Consequently, circuit 10 forms a comparator for comparing the input voltage Vin to the predetermined voltage Vref×C2/C1.

FIG. 3 illustrates another prior art circuit generally designated 50 for comparing a difference between voltage V1 and voltage V2 to a predetermined voltage Vref×C13/C. Using the same timing as in FIG. 2, and equating the total charge at T1 to the total charge at T2 yields the following:

$$Vf-Vi=C11\times V1/Ct+C12\times V2/Ct+C13\times Vref/Ct$$

$$Ct=C11+C12+C13+Cp10$$

Consequently,

Vo is logic 1 when V1–V2<Vref×C13/C

Vo is logic 0 when V1–V2>Vref×C13/C where C=C1= C2. While circuit 50 can perform a comparison of the difference between voltage V1 and the voltage V2 to a predetermined voltage, V1 is sampled at time T1 and V2 is sampled at time T2. If the differential voltage V1–V2 varies little from T1 to T2, then circuit 50 can provide a good comparison of the differential voltage to the predetermined voltage. However, if the differential voltage varies significantly from T1 to T2, then the difference between V1 at T1 and V2 at T2 is actually being compared to the predetermined voltage and not the instantaneous differential voltage.

Accordingly, a general object of the present invention is to provide a circuit which compares an instantaneous differential voltage to a predetermined voltage.

SUMMARY OF THE INVENTION

The invention resides in a circuit for comparing a difference between first and second voltages to a predetermined voltage. The circuit comprises an amplifier having first and second inputs. First and second capacitors are each coupled at one end to the first input of the amplifier. The first capacitor is charged with the first voltage and subsequently discharged. The second capacitor is charged with a first reference voltage and subsequently discharged. Third and fourth capacitors are each coupled at one end to the second input of the amplifier. The third capacitor is charged with the second voltage and subsequently discharged. The fourth capacitor is charged with a second reference voltage and subsequently discharged.

According to one feature of the invention, a timing control causes (a) the first and third capacitors to be charged during a first interval, (b) the second and fourth capacitors to be discharged during the first interval, (c) an output of the amplifier to be connected to the first input during at least part of the first interval, (d) the second and fourth capacitors to be charged during a second interval which follows the first interval, (e) the first and third capacitors to be discharged during the second interval, and (e) a third reference voltage to be connected to the second input of the amplifier during said part of the first interval.

DETAILED DESCRIPTION OF THE PREFERRED EMBODIMENTS

Figure 1:
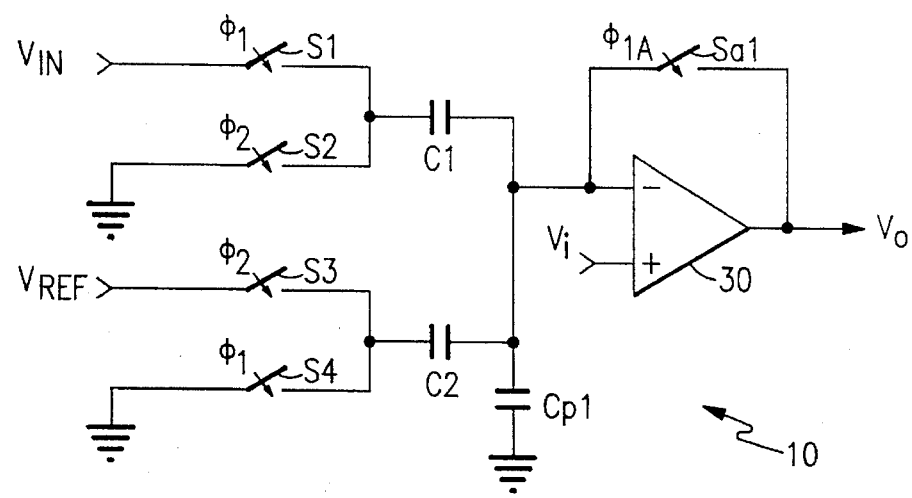
FIG. 1 is a circuit diagram of a circuit for comparing a single ended input voltage to a predetermined voltage according to the prior art.
Figure 2:
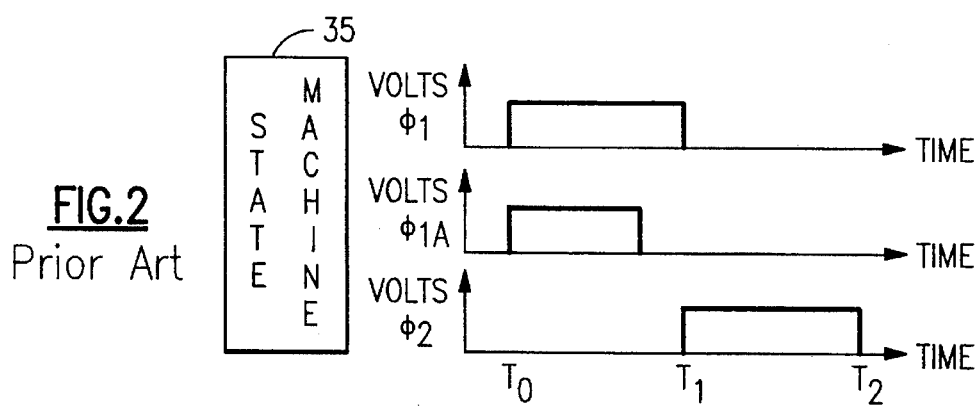
FIG. 2 is a timing diagram for operating switches within the circuits of FIGS. 1, 3 and 4.
Figure 3:
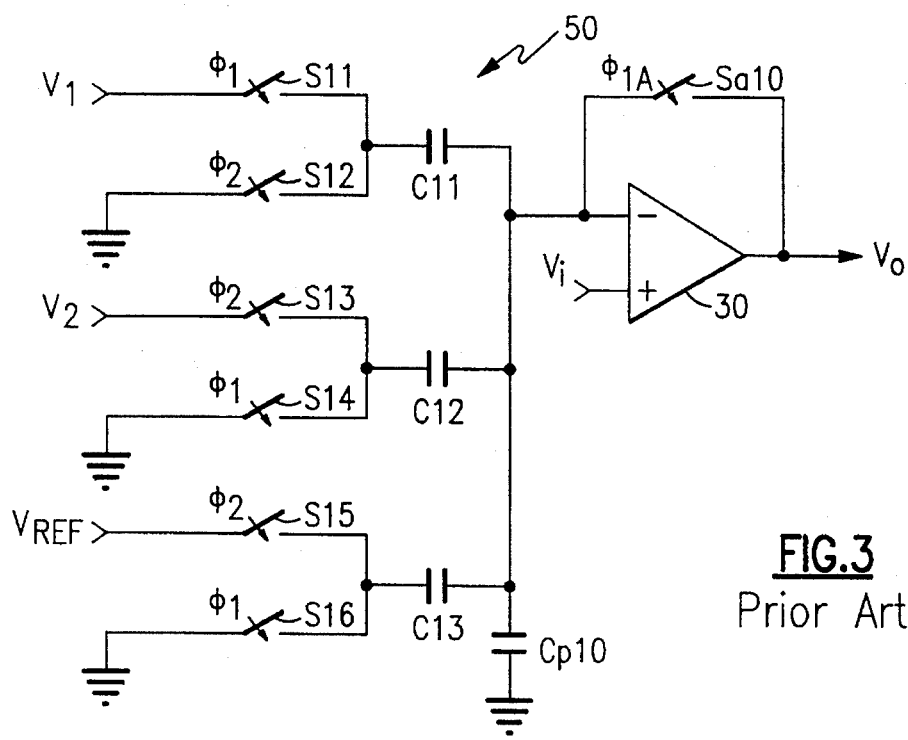
FIG. 3 is a circuit diagram of a circuit for comparing a slowly varying differential voltage to a predetermined voltage according to the prior art.
Figure 4:
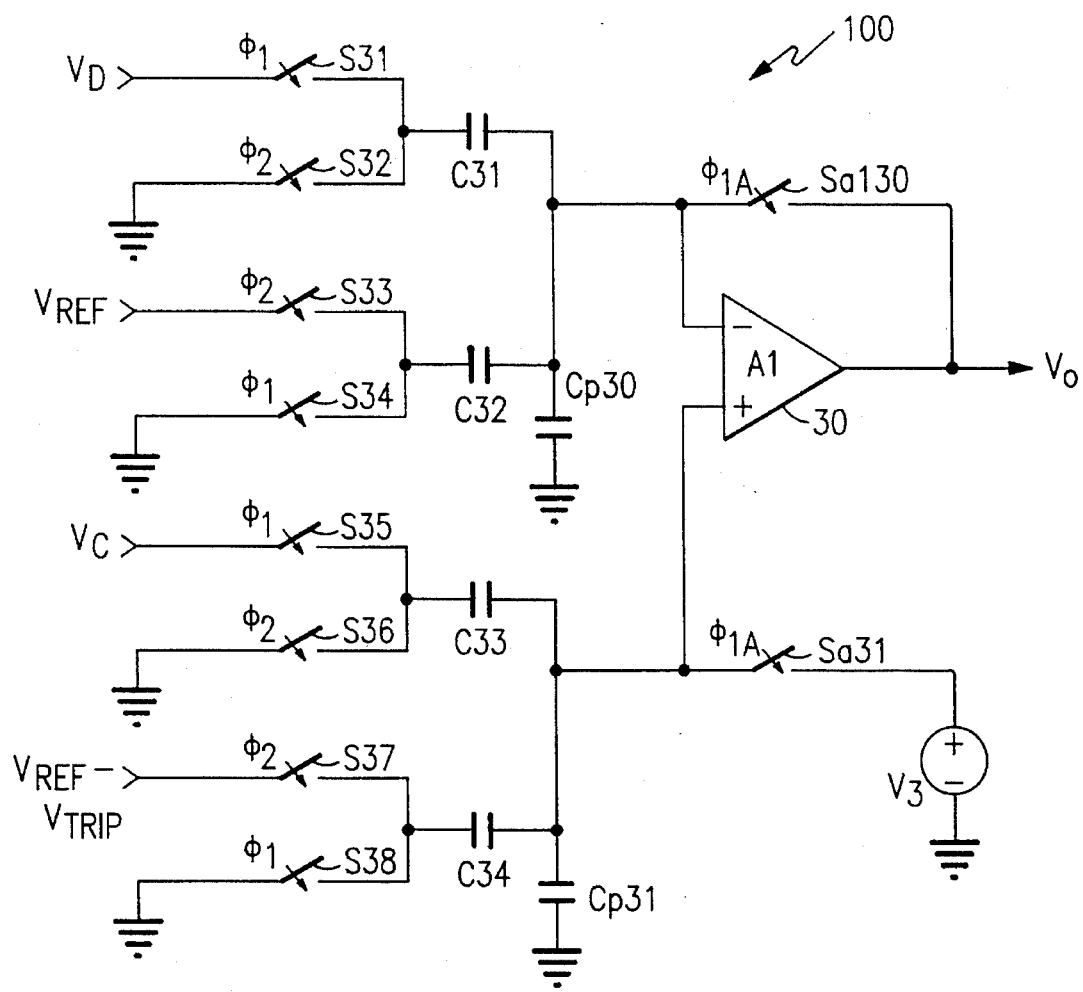
FIG. 4 is a circuit diagram of a circuit for comparing a slowly or rapidly varying differential voltage to a predetermined voltage according to the present invention.
Figure 5:
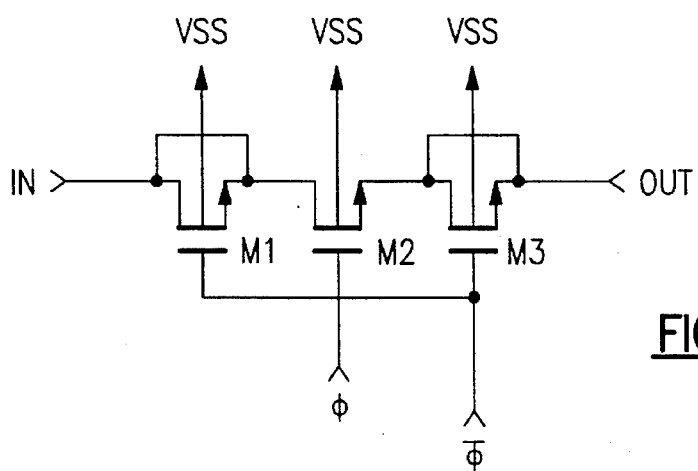
FIG. 5 is a circuit diagram of a MOS circuit for the switches within the circuit of FIG. 4.

Referring now to the remaining figures in detail wherein like reference numerals indicate like elements throughout all the figures, FIG. 4 illustrates a circuit generally designated 100 according to the present invention for comparing an instantaneous differential voltage Vd–Vc to a predetermined voltage Vtrip. Circuit 100 comprises ten identical MOS switches S31–S38, Sa30 and Sa31 which each comprise a single P or N channel transistor or three in series as illustrated in FIG. 5 and described in more detail below. The timing for operation of the switches S31–S38 and Sa30 and Sa31 is illustrated in FIG. 2. Circuit 100 also comprises four (intentional) precision capacitors C31–C34 formed by multiples of a unit capacitor whose size is chosen to be as small as possible but large enough to insure edge effects are insignificant. The value of a unit capacitor may be on the order of one picofarad. Capacitor ratios formed this way typically have an accuracy better than one percent. Switches S31–S38 serve to charge the precision capacitors to a voltage level or discharge the precision capacitors to ground as illustrated. There are also two parasitic capacitances Cp30 and Cp31 from the inverting and noninverting inputs, respectively of amplifier 30. Switch Sa30 selectively connects the output of amplifier 30 to the inverting input and switch Sa31 selectively connects a DC voltage source V3 to the noninverting input of amplifier 30. The output impedance and bandwidth of voltage source V3 are similar to the output impedance and bandwidth of amplifier 30; voltage source V3 can be provided by another amplifier similar to amplifier 30.

At time T1, the voltage at the inverting input of amplifier 30 is V3 (as is the voltage at the noninverting input) because switch Sa30 is closed, and the total charge Qt1inv is as follows:

$$Qt1inv = Q31 + Q32 + Qp30$$
$$= C31(V3 - Vd) + C32 \times V3 + Cp30 \times V3$$

At time T2, the voltage at the inverting input of amplifier 30 is unknown and represented by Vf1, and the total charge Qt2inv is as follows:

$$Qt2inv = Q31 + Q32 + Qp30$$
$$= C31 \times Vf1 + C32(Vf1 - Vref) + Cp30 \times Vf1.$$

The total charge at the inverting input of amplifier 30 is constant from T1 to T2 due to conservation of charge. Consequently, setting Qt1inv= Qt2inv results in the following:

$$Vf1 - V3 = -C31 \times Vd/Ct + C32 \times Vref/Ct$$

Also, $Ct=C31+C32+Cp30$.

Likewise, at time T1 the voltage at the noninverting input is V3 and the total charge is as follows:

$$Qt1non = Q33 + Q34 + Qp31$$
$$= C33(V3 - Vc) + C34 \times V3 + Cp31 \times V3$$

At time T2, the voltage at the noninverting input of amplifier is unknown and represented by Vf2 and the total charge is as follows:

$$\begin{aligned} Qt2non &= Q33 + Q34 + Qp31 \\ &= C33 \times Vf2 + C34(Vf2 - (Vref - Vtrip)) + \\ &\quad Cp31 \times Vf2 \end{aligned}$$

The total charge at the noninverting input of amplifier 30 is constant from T1 to T2 due to conservation of charge. Consequently, setting Qt1non=Qt2non results in the following:

$$Vf2 - V3 = -C33 \times Vc/Ct + C34(Vref - Vtrip)/Ct$$

and $$\begin{aligned} Vo &= Av((Vf1 - V3) - (Vf2 - V3)) \\ &= Av \times A((Vd - Vc) - Vtrip) \end{aligned}$$

where

Av is the open loop gain of amplifier 30, and

A=C31/Ct=C32/Ct=C33/Ct=C34/Ct. Because the open loop gain, Av, of amplifier 30 is very large, for example, 10,000

Vo is logic 1 when (Vd–Vc)> Vtrip

Vo is logic 0 when (Vd–Vc)< Vtrip. Thus, circuit 100 compares the difference between Vd and Vc to a predetermined reference Vtrip. Also, Vd and Vc are measured at the same time because both switches S34 and S35 are closed at the same time as indicated by the common control Phi1, and both switches S32 and S36 are closed at the same time as indicated by the common control Phi2. Therefore, circuit 100 provides a comparison of the instantaneous differential voltage Vd–Vc to the predetermined reference in accordance with the object of the present invention.

The following are other design considerations for components of circuit 100. When high, the control signal Phi1a causes the voltage V3 to be applied to the noninverting input of amplifier 30 and the output of amplifier 30 to be applied to the inverting input. The short circuit feedback causes unity gain in which the amplifier 30 output exhibits the voltage V3 plus any offset between the noninverting and inverting inputs. Thus, the effective offset between the differential inputs is 1/Av where Av is the open loop gain of amplifier 30. Consequently, the offset has been minimized and the comparator has been auto-zeroed or auto-balanced to improve precision.

Because differential amplifier 30 is required to exhibit unity gain during closure of switches Sa30 and Sa31, the gain should be one over the entire bandwidth. This may require attenuating or rolling off the gain of amplifier 30 at high frequencies using a low pass filter in parallel with switch Sa30. However, such attenuation should not degrade the unit step response requiring a longer interval from T31 to T32 in which amplifier 30 is in the open loop mode. Therefore, according to the preferred embodiment of the present invention, the gain is rolled-off during the time that switches Sa30 and Sa31 are closed, but not rolled-off during the interval T1 to T2.

FIG. 5 illustrates in detail each of the switches S31–S38, Sa30 and Sa31. While a single MOS transistor such as M2 is sufficient to pass or block a unidirectional signal and can be used in circuit 100 as well as the two directional design of U.S. Pat. 4,899,068, the single MOS transistor or double MOS transistors of U.S. Pat. 4,899,068 introduce an inherent non-linear capacitance which causes a feed through error. Because of the large gain of amplifier 30, any such error is amplified greatly. Additional MOS transistors M1 and M3 in series with MOS transistor M2 and having their drain and source terminals shorted together cancel some of the feedthrough error because the output of phase clock at the gates of M1 and M3 feeds through the gate capacitance to cancel the feed through of the clock at the gate of M2. Also, feedthrough error is reduced because the output impedance of amplifier 30 is similar to the output impedance of voltage source V3.

Based on the foregoing, a circuit for comparing an instantaneous differential voltage to a predetermined voltage has been disclosed. However, numerous modifications and substitutions can be made without deviating from the scope of the present invention. Therefore, the present invention has been disclosed by way of illustration and not limitation and reference should be made to the following claims to determine the scope of the present invention.

We claim:

1. A circuit for comparing a difference between first and second voltages to a predetermined voltage, said circuit comprising:

an amplifier having first and second inputs;

first and second capacitors each coupled at one end to said first input;

means for charging said first capacitor with said first voltage during a first interval;

means for charging said second capacitor with a first reference voltage during a second interval, said second interval following said first interval;

third and fourth capacitors each coupled at one end to said second input;

means for charging said third capacitor with said second voltage during said first interval;

means for charging said fourth capacitor with a second reference voltage during said second interval; and switch means for connecting an output of said amplifier to said first input during an initial part of said first interval and disconnecting said output from said first input during a remainder of said first interval and during said second interval.

2. A circuit as set forth in claim 1 further comprising means for connecting a third reference voltage to said second input during an initial part of said first interval.

3. A circuit as set forth in claim 2 further comprising timing means for causing said second and fourth capacitors to be discharged during said first interval.

4. A circuit as set forth in claim 3 further comprising:

timing means for causing said first and third capacitors to be discharged during said second interval by the respective discharging means.

5. A circuit for comparing a difference between first and second voltages to a predetermined voltage, said circuit comprising:

an amplifier having first and second inputs;

first and second capacitors each coupled at one end to said first input;

means for charging said first capacitor with said first voltage and subsequently discharging said first capacitor;

means for charging said second capacitor with a first reference voltage and subsequently discharging said second capacitor;

third and fourth capacitors each coupled at one end to said second input;

means for charging said third capacitor with said second voltage and subsequently discharging said third capacitor;

means for charging said fourth capacitor with a second reference voltage and subsequently discharging said fourth capacitor; and means for connecting a third reference voltage to said second input.

6. A circuit as set forth in claim 5 further comprising switch means for connecting an output of said amplifier to said first input.

7. A circuit for comparing a difference between first and second voltages to a predetermined voltage, said circuit comprising:

an amplifier having first and second inputs;

first and second capacitors each coupled at one end to said first input;

means for charging said first capacitor with said first voltage and subsequently discharging said first capacitor;

means for charging said second capacitor with a first reference voltage and subsequently discharging said second capacitor;

third and fourth capacitors each coupled at one end to said second input;

means for charging said third capacitor with said second voltage and subsequently discharging said third capacitor;

means for charging said fourth capacitor with a second reference voltage and subsequently discharging said fourth capacitor;

timing means for causing said first and third capacitors to be charged by the respective charging means during a first interval;

timing means for causing said second and fourth capacitors to be discharged during said first interval;

switch means for connecting an output of said amplifier to said first input and; and timing means for causing said switch means to connect said output of said amplifier to said first input during at least part of said first interval.

8. A circuit for comparing a difference between first and second voltages to a predetermined voltage, said circuit comprising:

an amplifier having first and second inputs;

first and second capacitors each coupled at one end to said first input;

means for charging said first capacitor with said first voltage and subsequently discharging said first capacitor;

means for charging said second capacitor with a first reference voltage and subsequently discharging said second capacitor;

third and fourth capacitors each coupled at one end to said second input;

means for charging said third capacitor with said second voltage and subsequently discharging said third capacitor;

means for charging said fourth capacitor with a second reference voltage and subsequently discharging said fourth capacitor;

timing means for causing said first and third capacitors to be charged by the respective charging means during a first interval;

timing means for causing said second and fourth capacitors to be discharged during said first interval;

timing means for causing said second and fourth capacitors to be charged by the respective charging means during a second interval which follows said first interval;

timing means for causing said first and third capacitors to be discharged during said second interval by the respective discharging means; and means for connecting a third reference voltage to said second input during a third interval within said first interval.

9. A circuit as set forth in claim 8 further comprising means for connecting an output of said amplifier to said first input during said third interval.

10. A circuit for comparing a difference between first and second voltages to a predetermined voltage, said circuit comprising:

an amplifier having first and second inputs;

first and second capacitors each coupled at one end to said first input;

first and second switches each connected at one end to the other end of said first capacitor, said first switch connected at the other end to a port for receiving said first voltage, said second switch connected at the other end to ground;

third and fourth switches each connected at one end to the other end of said second capacitor, said third switch connected at the other end to a port for receiving a first reference voltage, said fourth switch connected at the other end to ground;

third and fourth capacitors each coupled at one end to said second input;

fifth and sixth switches each connected at one end to the other end of said third capacitor, said fifth switch connected at the other end to a port for receiving said second voltage input, said sixth switch connected at the other end to ground;

seventh and eighth switches each connected at one end to the other end of said fourth capacitor, said seventh switch connected at the other end to a port for receiving a second reference voltage, said eighth switch connected at the other end to ground; and a ninth switch connected between a third reference voltage and said second input.

11. A circuit as set forth in claim 10 wherein values of said first, second, third and fourth capacitors are the same as each other.

12. A circuit as set forth in claim 10 wherein each of said switches comprises a MOS transistor.

13. A circuit for comparing a difference between first and second voltages to a predetermined voltage, said circuit comprising:

an amplifier having first and second inputs;

first and second capacitors each coupled at one end to said first input;

first and second switches each connected at one end to the other end of said first capacitor, said first switch connected at the other end to a port for receiving said first voltage, said second switch connected at the other end to ground;

third and fourth switches each connected at one end to the other end of said second capacitor, said third switch connected at the other end to a port for receiving a first reference voltage, said fourth switch connected at the other end to ground;

third and fourth capacitors each coupled at one end to said second input;

fifth and sixth switches each connected at one end to the other end of said third capacitor, said fifth switch connected at the other end to a port for receiving said second voltage input, said sixth switch connected at the other end to ground;

seventh and eighth switches each connected at one end to the other end of said fourth capacitor, said seventh switch connected at the other end to a port for receiving a second reference voltage said eighth switch connected at the other end to ground;

a ninth switch connected between an output of said amplifier and said first input of said amplifier; and a tenth switch connected between a third reference voltage and said second input of said amplifier.

14. A circuit as set forth in claim 13 further comprising:

means for closing said first, fourth, fifth and eighth switches during a first interval; and means for closing said second, third, sixth and seventh switches during a second subsequent interval.

15. A circuit as set forth in claim 14 wherein said second interval begins when said first interval ends.

16. A circuit as set forth in claim 14 further comprising means for closing said ninth and tenth switches during a third interval within or concurrent with said first interval.

17. A circuit as set forth in claim 16 wherein said third interval ends before an end of said first interval.

18. A circuit as set forth in claim 17 wherein said third interval begins when said first interval begins.

19. A circuit for comparing a difference between first and second voltages to a predetermined voltage, said circuit comprising:

an amplifier having first and second inputs;

first and second capacitors each coupled at one end to said first input;

first and second switches each connected at one end to the other end of said first capacitor, said first switch connected at the other end to a port for receiving said first voltage, said second switch connected at the other end to ground;

third and fourth switches each connected at one end to the other end of said second capacitor, said third switch connected at the other end to a port for receiving a first reference voltage, said fourth switch connected at the other end to ground;

third and fourth capacitors each coupled at one end to said second input;

fifth and sixth switches each connected at one end to the other end of said third capacitor, said fifth switch connected at the other end to a port for receiving said second voltage input, said sixth switch connected at the other end to ground; and seventh and eighth switches each connected at one end to the other end of said fourth capacitor, said seventh switch connected at the other end to a port for receiving a second reference voltage, said eighth switch connected at the other end to ground; and wherein said predetermined voltage is the difference between said first and second reference voltages.

20. A circuit for comparing a difference between first and second voltages to a predetermined voltage, said circuit comprising:

an amplifier having first and second inputs;

first and second capacitors each coupled at one end to said first input;

first and second switches each connected at one end to the other end of said first capacitor, said first switch connected at the other end to a port for receiving said first voltage, said second switch connected at the other end to ground;

third and fourth switches each connected at one end to the other end of said second capacitor, said third switch connected at the other end to a port for receiving a first reference voltage, said fourth switch connected at the other end to ground;

third and fourth capacitors each coupled at one end to said second input;

fifth and sixth switches each connected at one end to the other end of said third capacitor, said fifth switch connected at the other end to a port for receiving said second voltage input, said sixth switch connected at the other end to ground; and seventh and eighth switches each connected at one end to the other end of said fourth capacitor, said seventh switch connected at the other end to a port for receiving a second reference voltage, said eighth switch connected at the other end to ground; and wherein each of said switches comprises three MOS transistors having their source drain paths in series with one another and the drain of one of the transistors is shorted to the source of the same transistor.

21. A circuit for comparing a difference between first and second voltages to a predetermined voltage, said circuit comprising:

an amplifier having first and second inputs;

a first capacitor coupled at one end to said first input;

first switch means for charging said first capacitor with said first voltage during a first interval;

a second capacitor coupled at one end to said second input;

second switch means for charging said second capacitor with said second voltage during said first interval; and third switch means for connecting a third reference voltage to said second input during a part of said first interval.

22. A circuit as set forth in claim 21 further comprising fourth switch means for connecting an output of said amplifier to said first input during a part of said first interval.

23. A circuit as set forth in claim 21 further comprising:

a third capacitor coupled at one end to said first input;

fifth switch means for charging said third capacitor with a first reference voltage during a second interval, said second interval following said first interval;

a fourth capacitor coupled at one end to said second input; and sixth switch means for charging said fourth capacitor with a second reference voltage during said second interval; and wherein said first switch means discharges said first capacitor during said second interval;

said second switch means discharges said second capacitor during said second interval; and said third and fourth switch means are open during said second interval.

24. A circuit as set forth in claim 22 wherein said part is an initial part of said first interval.

25. A circuit for comparing a difference between first and second voltages to a predetermined voltage, said circuit comprising:

an amplifier having first and second inputs;

a first capacitor coupled at one end to said first input;

first switch means for charging said first capacitor with said first voltage during a first interval;

a second capacitor coupled at one end to said second input;

second switch means for charging said second capacitor with said second voltage during said first interval; and third switch means for connecting an output of said amplifier to said first input during a part of said first interval.

* * * * *